United States Patent

Schlangenotto et al.

[11] Patent Number: 5,923,055
[45] Date of Patent: Jul. 13, 1999

[54] CONTROLLABLE SEMICONDUCTOR COMPONENT

[75] Inventors: Heinrich Schlangenotto; Marius Fuellmann, both of Neu Isenburg, Germany; Jacek Korec, San Jose, Calif.; Alexander Bodensohn, Offenbach, Germany

[73] Assignee: Daimler-Benz Aktiengesellschaft, Stuttgart, Germany

[21] Appl. No.: 08/809,848

[22] PCT Filed: Sep. 22, 1995

[86] PCT No.: PCT/EP95/03742

§ 371 Date: Mar. 21, 1997

§ 102(e) Date: Mar. 21, 1997

[87] PCT Pub. No.: WO96/09649

PCT Pub. Date: Mar. 28, 1996

[30] Foreign Application Priority Data

Sep. 22, 1994 [DE] Germany .................. 44 33 796

[51] Int. Cl.[6] .......................... H01L 29/74; H01L 31/111
[52] U.S. Cl. ........................ 257/147; 257/152; 257/153
[58] Field of Search .................... 257/133, 140, 257/141, 147, 152, 153

[56] References Cited

U.S. PATENT DOCUMENTS 5,194,394  3/1993  Terashima .......................... 257/133
5,298,769  3/1994  Omura et al. ....................... 257/138

FOREIGN PATENT DOCUMENTS 0028799  5/1981  European Pat. Off. .
0224091  6/1987  European Pat. Off. .
0329993  8/1989  European Pat. Off. .
0559945  9/1993  European Pat. Off. .
2535529  5/1984  France .

OTHER PUBLICATIONS

C. Braun: "Circuit–Level Modelling of MOS Controlled thyristors". In: IEEE 1990 Power Modulator Symposium, Jun. 1990, San Diego, USA, pp. 436–440.

Primary Examiner—Wael M. Fahmy
Attorney, Agent, or Firm—Venable; George H. Spencer; Norman N. Kunitz

[57] ABSTRACT

The invention concerns a semiconductor component which can be controlled on the anode side and whose semiconductor body comprises a plurality of adjacent, parallel-connected unit cells having a thyristor structure. A lightly doped n-base region (3) is adjoined on both sides by highly doped p-regions constituting p-base region (2) and p-emitter region (4). The p-base region (2) is followed by a highly doped n-emitter (1) which contacts a cathode electrode (7). Integrated in the p-emitter region (4) is a first n-channel MOSFET (M1) which is connected in series with the thyristor structure by means of a floating electrode (FE). The drain electrode (5b) of the first MOSFET (M1) is provided with an outer anode (8) which has no contact with the p-emitter region (4). A second n-channel MOSFET (M2) is integrated between the n-base region (3) and the drain region (5b) of the first MOSFET (M1).

19 Claims, 6 Drawing Sheets

CONTROLLABLE SEMICONDUCTOR COMPONENT

BACKGROUND OF THE INVENTION

The invention relates to an anode-side actuated semiconductor component, for which the semiconductor element has a plurality of side-by-side arranged, parallel connected unit cells with thyristor structure, and to bidirectional semiconductor switches with such an anode-side actuated semiconductor component.

Bidirectional semiconductor components, which can be switched on and, if possible, also switched off by a control signal in both polarity directions of the main electrodes are highly advantageous for alternating current uses. A frequently used component of this type is the Triac, which comprises two antiparallel-arranged thyristor structures and can be switched on through gate current, independent of the polarity sign of the voltage that is present. The Triac cannot be switched off via the gate, but only through a polarity reversal of the main electrodes.

A component, which can be switched on as well as off by a MOS gate in both polarity directions was described in IEEE Transactions on Electron Devices, Vol. ED–27 (1980), pp 380–87. This so-called TRIMOS (MOS-Triac) is a lateral component, comprising two DMOS transistors in a laterally reversed arrangement, for which the gate electrodes are mutually connected. The voltage range is limited in this case by the breakdown voltage of the gate oxide and typically only extends to about 50 V. If the gate electrodes are separated and actuated individually, voltages of up to 300 V can be reached. It is favorably in this case that the component functions at higher currents like an IGBT, so that the on-resistance is reduced through conductivity modulation. However, advantages during the actuation are lost again when separating the gate electrodes.

A bilaterally switching component with thyristor structure and lateral layout, which is referred to as BEST (bilateral emitter switched thyristor), was presented at the International Electron Device Meeting IEDM 1992 (IEDM'92 Conference Volume, pp 249–252). The blocking capacity of the component was less than 70 V. The characteristics are comparable to those of the TRIMOS. Not only the voltage range, but also the switchable current is narrowly limited as a result of the lateral layout of these switching elements. A separate MOS gate is provided for switching on and switching off in each current direction, which is actuated by the cathode electrode of the respective current direction. This is a disadvantage because of the expenditure for the driver electronics. Such a concept is not suitable for vertical bidirectional components.

The standard power components such as the MOSFET, the insulated gate bipolar transistor or IGBT, the normal bipolar transistor and the (GTO) thyristor are actuated from the cathode and require a positive control voltage for the switching on. For a bidirectional switch, which referred to a (relatively small) gate signal can be switched to a fixed main electrode, an anode-side actuated components is necessary in addition to the standard cathode-side actuated component. By exchanging n- and p-conductivity type in the various semiconductor zones, anode-side actuated components are obtained from the aforementioned standard structures. However, these have the disadvantage is that they cannot be integrated together with the standard ones, among other things because the weakly doped base for absorbing the voltage has the reversed conductivity type, namely p-conductivity. A second disadvantage of this anode-side actuated component is that the gate signal must have a polarity for the switching that is the reverse of the normal one: a negative voltage at the gate is necessary for switching on. A bidirectional switch with such individual components thus requires control signals for the switching on and off, which depend on the current direction, so that the control signal changes, among other things, for the zero passage of the current. A very involved driver electronics is consequently required.

A MOS-controlled thyristor was suggested in the German Patent Application P 44 02 877, which can be switched on and off in series to the thyristor structure by a p-channel MOSFET that is integrated into the n-emitter zone. During the switching off, a voltage that builds up at the MOSFET is transmitted as a negative gate voltage to the p-base of the thyristor by a second integrated MOSFET, which switches on automatically once the first one is switched off. This permits an efficient switching off. The externally actuated MOSFET and the thyristor are integrated by using a second, internal MOSFET of the type of a known cascode circuit. The component permits a high on-state current per surface with low on-state voltage, can be used up to high blocking voltages, and has a characteristic with current limitation.

As described in this patent application, an inverse component is obtained by exchanging the n- and p-conductance in the various semiconductor zones, which can be actuated from the anode side. Like the standard components, this component is switched on by positive gate voltage and is switched off by removing or reversing the gate signal. Since it has a weakly doped p-base zone for absorbing the voltage, it is not suited to monolithic integration together with the standard components, which have a transistor or thyristor structure.

SUMMARY OF THE INVENTION

The invention is based on the general problem of creating a bidirectionally driven component, which can be switched on and off through MOS gate and is suitable for a higher voltage and current range than the known components that can be switched on and off bidirectionally and which has a stable switching behavior. It must be possible to actuate the component for both current directions from the same main electrode, that is with the same polarity as the control pulse.

One partial problem with the invention is in this case the creation of a MOS component that can be actuated from the anode side and can be integrated together with traditional components having transistor or thyristor structure. Such an anode-side actuated component is important per se, since it can be produced with technology used for standard components. It should be possible to actuate the component with positive control voltage (relative to the anode) and to switch it off by removing or reversing the control voltage.

The solution according to the invention for a semiconductor component of the aforementioned type is that higher doped p-zones as p-base zone and p-emitter zone adjoin a weakly doped n-base zone on both sides and that the p-base zone is followed by a highly doped n-emitter zone, contacted with a cathode electrode, that in the p-emitter zone a first n-channel MOS field effect transistor is connected in series with the thyristor structure by a floating electrode, that the drain electrode of the first MOS field effect transistor has an outer anode electrode that has no contact with the p-emitter zone, and that a second n-channel MOS field effect transistor is integrated between the n-base zone and the drain zone of the first MOS field effect transistor. This semiconductor component can be integrated, together with other components that are known per se to produce specific electrical functions, specifically to produce a bidirectional, switchable component with only one gate, which can be actuated with the same voltage, independent of the current direction.

For one preferred embodiment, the insulated gate for the second MOS field effect transistor, which is located above the p-region between the n-base and the $n^+$-region, is connected with the outer anode. Since the above-described component is a special type of an inverse, cascode-switched MOS thyristor, it is henceforth designated with the abbreviation ICMT. The MOS field effect transistor is in the following called a MOSFET.

Even though the ICMT is an inverse component, the weakly doped n-base zone and the higher doped p-zones that adjoin on both sides, as well as the following $n^+$-zones, result in a design with a structure that corresponds largely to that of standard transistor or thyristor components. The anode-side actuated component therefore can easily be integrated with standard components on a semiconductor chip. The ICMT as individual component can be produced economically with technology used for the standard components.

One preferred embodiment provides that the division into unit cells is through a trough-shaped embodiment for the p-emitter zone, that two spaced apart $n^+$-zones are embedded into the p-emitter zone parallel to its edge on at least one side, that the $n^+$-zones with the interposed p-region of the p-emitter zone and an above-arranged insulated gate electrode form the first n-channel MOS field effect transistor, that the one $n^+$-region adjoining the edge of the trough-shaped p-emitter zone, together with the n-base zone that emerges at the surface and the segment of the p-emitter zone that is located between them as well as an above-arranged gate electrode form the second n-channel MOS field effect transistor, that the other $n^+$-zone and the p-emitter zone have a joint floating electrode, and that the $n^+$-zone that adjoins the edge is connected to the outer anode electrode, which has no contact with the p-emitter zone.

An ICMT of the above-described type can be realized either with lateral or vertical thyristor structure. For a vertical embodiment, the n-emitter zone, the p-base zone, the n-base zone, the p-emitter zone and the anode contact are arranged one above the other, wherein the cathode contact connected to the n-emitter zone is located on the lower limiting level and the anode electrode as well as the gate electrode are arranged on the upper limiting level of the semiconductor element.

For a lateral embodiment, the weakly doped n-base zone is arranged on a substrate, from which it is separated by an insulating layer or a pn-junction. The p-base zone and the p-emitter zone are embedded in the shape of a trough into the n-base zone, at a lateral distance that is predetermined by the blocking capacity. The n-emitter zone is embedded into the p-base zone and the source and drain zones for the first MOS field effect transistor are embedded into the p-emitter zone.

The series-connected thyristor must be ignited so that the component is activated when the first MOSFET is switched on and a negative voltage is present at the cathode. The thyristor can be ignited by designing it such that it blocks per se in the switching direction. However, it is preferable if the thyristor has a forward blocking capacity. In that case, it is provided in accordance with the invention with a special device for igniting it through the gate on the anode side, without access to the n- and p-base zones. Such an ignition arrangement is embodied in that at a larger distance from the region with unit cells and separated from these or by interrupting the p-emitter zone, an ignition region is provided in the semiconductor element, which comprises a p-emitter zone with bordering n-base zone, the following p-base zone and the subsequently following n-emitter zone, wherein the p-emitter zone is provided with an ignition gate contact and has a $n^+$-zone, for which the contact electrode is connected to the floating electrode, but does not short-circuit the pn-junction in the ignition region between the p-emitter zone and the embedded $n^+$-zone. With the aid of this ignition region, the semiconductor element can be switched on and off by the gate. An alternative arrangement for switching on the thyristor structure provides for a surface channel zone at the edge of the semiconductor element, which connects the p-emitter zone with the p-channel zone, but which is interrupted in the switched-off position by the voltage that develops at a MOS gate.

One preferred lateral embodiment of the semiconductor element that can be switched on and off by MOS gate and is actuated from the anode side is described.

A bidirectional semiconductor switch according to the invention is designed such that an anode-side actuated semiconductor component of the above described type is arranged in a hybrid circuit, together with a cathode-side actuated semiconductor component that is known per se. With such a semiconductor component, the anode connection for the anode-side actuated semiconductor component and the cathode connection of the cathode-side actuated semiconductor component are connected to form a joint first main electrode and the cathode of the anode-side actuated semiconductor component as well as the anode of the cathode-side actuated semiconductor component are connected to form a second main electrode. The gate electrodes for the two semiconductor components are preferably combined to form a joint gate electrode.

A monolithically integrated, bidirectionally switchable semiconductor component according to the invention is designed such that unit cells of the anode-side actuated semiconductor component of the above described type are arranged in a semiconductor element with unit cells of a cathode-side actuated semiconductor component and that the unit cells of the anode-side actuated semiconductor component are arranged in a first region and the unit cells of the cathode-side actuated semiconductor components are arranged in a second region of the semiconductor element. The unit cells of the known cathode-side actuated semiconductor element in the second region preferably form an insulated gate bipolar transistor (IGBT) with an anode side p-zone, a n-base zone and a cathode-side p-zone, into which an $n^+$-zone is embedded and which, together with the n-base zone, the cathode-side p-zone region located between and an insulated gate, form an MOS field effect transistor, wherein the cathode-side electrode with the anode electrode and the anode-side electrode with the cathode electrode of the anode-side actuated semiconductor component and the gate electrode of the anode-side actuated semiconductor component are preferably connected to form a joint gate electrode.

If the thyristor structure is designed without forward blocking capacity, the n-emitter zone and the p-base zone of the anode-side actuated semiconductor component in the first region are separated from the anode-side p-zone of the cathode-side actuated semiconductor component in the second region in the border area between the first and second regions to avoid a short-circuit. Various suitable means for the separation are described.

As an alternative to the above described embodiment, an ignition gate can be provided in a region separated from or positioned at a distance to the first region, which has a p-zone with gate contact embedded in a trough shape in the n-base zone, which gate contact is connected to the gate electrode of the anode-side actuated component and which furthermore has a second p-zone embedded into the n-base zone, which is connected to the first p-zone by a depletion-type MOS field effect transistor and comprises a $n^+$-zone with a contact electrode, wherein this contact electrode is connected to the floating electrode and the gate electrode of the depletion-type MOS field effect transistor is connected to the contact electrode of a p-zone additionally embedded into the n-base zone that is positioned in the space charge region surrounding the pn-junction for the reverse blocking operation of the anode-side actuated component.

An additional bidirectionally switchable semiconductor component according to the invention is composed of a single group of unit cells of the above described type that are themselves bidirectionally switchable and originate with the above-described ICMT unit cells, in that some segments of the n-emitter zone and the p-base zone are replaced by a p-zone that adjoins the cathode metallization, which is separated in the above-described manner from the n-emitter zone and p-base zone, wherein the anode metallization and the cathode metallization are connected to a first and second main electrode and the gate electrode is separated from the second main electrode and is connected to a gate connection that is separate from the gate connection for the first MOSFET, so that if the second MOS field effect transistor gate is conductively connected to the first main electrode, the function of the anode-side actuated semiconductor component that can be switched through the first MOS field effect transistor gate is maintained and with a positive actuation of the gate for the first MOS field effect transistor, the function of the insulated gate bipolar transistor that can be switched on the cathode side by the gate for the second MOS field effect transistor is maintained.

In this embodiment, each unit cell is designed as bidirectional switch per se, which can switch the current on and off in both flow directions. A significant advantage of this embodiment is that it requires less semiconductor surface space.

The invention is described in more detail below with the aid of exemplary embodiments shown in a drawing, from which further details, features and advantages follow.

BRIEF DESCRIPTION OF THE DRAWINGS

FIGS. 6a–d show the bidirectional component according to FIG. 4 in various operating conditions, with;

DETAILED DESCRIPTION OF THE PREFERRED EMBODIMENTS

Figure 1:
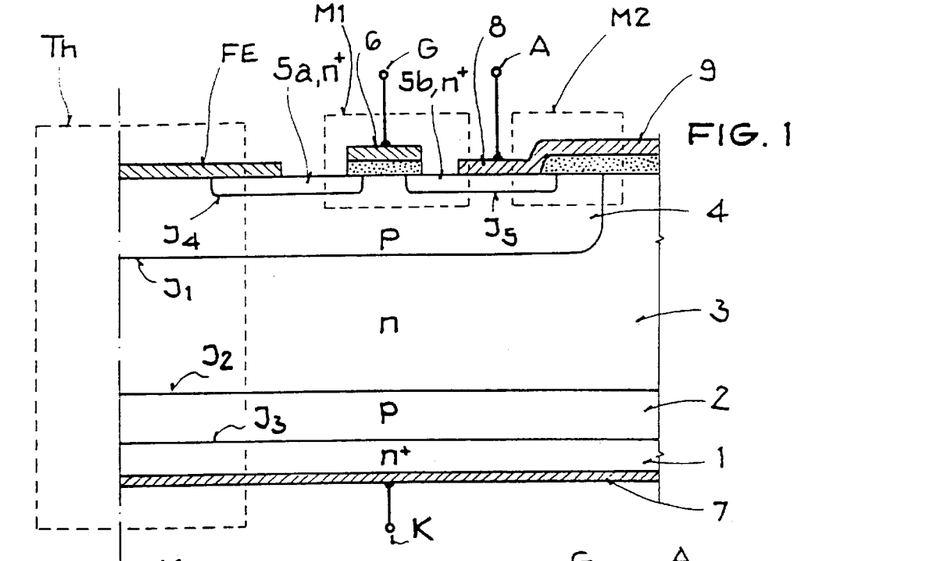
FIG. 1 is a section of a unit cell for an inventive, anode-side actuated MOS component (ICMT element) that can be integrated.

FIG. 1 shows a sectional cut of a unit cell for an inventive, anode-side actuated semiconductor component. The unit cell comprises a weakly doped n-base zone 3, which is joined below and above by higher doped p-zones 2 or 4.

The lower p-zone 2 is followed below by a highly doped $n^+$-zone 1. This zone represents the cathode emitter of a thyristor structure, formed by the layer sequence 1, 2, 3, 4. The upper p-zone 4 is shaped like a trough, and formed in the n-base zone 3 such that the n-base zone 3 on the sides emerges at the upper major surface of the device. Two $n^+$-zones 5a, 5b are embedded into the p-trough 3 for each half a unit cell. The portion of p-region in-between the zones 5a and 5b is provided with an insulated gate electrode 6 in the surface of the devices; so that a lateral n-channel MOSFET M1 is formed. The insulating layer underneath the gate electrode 6 as a rule is composed of silicon dioxide, the gate electrode 6 of doped polysilicon. The $n^+$-zone 1 is covered with a cathode metallization 7 that is connected to a cathode connection K. The anode emitter zone 4 of the thyristor that emerges on the surface beside the MOSFET region has a floating connecting electrode FE, which simultaneously makes contact with the neighboring $n^+$-zone 5a of the MOSFET M1 and thus connects the vertical thyristor 1, 2, 3, 4 with the lateral MOSFET M1 from the zones 5a, 4, 5b. The $n^+$-region 5b of MOSFET M1 that faces away from the connecting electrode FE has an anode contact 8 that is connected to the outer anode connection A and which has no contact with the anode emitter zone 4 of the thyristor. The gate electrode 6 of the MOSFET M1 is connected to the gate connection G.

The unit cell of the inverse component according to FIG. 1 also comprises a second MOSFET M2, which is formed by the $n^+$-zone 5b, which is provided with the anode contact and positioned at the edge of the p-trough, the n-base zone 3 that is pulled to the surface and the region of p-zone 4 that is located in-between the zone 5b and the zone 3 of the surface and for which the insulated gate electrode 9 is connected to the zone 5b and the zone 3 of the surface outer anode contact 8 of the $n^+$-zone 5b or is also formed by it.

The structure according to FIG. 1 generally must be understood to be half a unit cell, from which a complete unit cell is formed through a laterally reversed arrangement. Such a cell referred to as an ICMT also comprises a second pair of $n^+$-zones at the side opposite the p-trough, so that the MOSFETs M1 and M2 extend there as well.

The component according to FIG. 1 is based on a modification of the component described in the above mentioned German Patent Application P 44 02 877, which we hereby refer to, in order to create an inverse component that can be integrated with standard switching components. Instead of being integrated into the n-emitter zone of the thyristor in the aforementioned patent application, the MOSFET M1, which is connected in series with the thyristor, is in this case integrated into the anode emitter zone and is designed as an n-channel MOSFET. Embodiments for switching on and obtaining a stable reverse blocking behavior are described in the following. As previously mentioned, the unit cell can be viewed as a cascode-type integration of a thyristor with a MOSFET (M1). In addition to the desired anode-side actuation and integrating ability, this embodiment of the component has the advantage that the MOSFET M1 that is connected in series with the thyristor is the n-channel type, which has a charge carrier mobility that is higher by a factor of 3 to 4 than that of a p-channel MOSFET. However, the cathode-side npn-transistor, which now cannot be accessed through the gate, has a higher current amplification factor and a higher avalanche multiplication factor than a pnp-transistor. For a predetermined voltage to be switched, the n-base zone 3 must therefore be selected to be thicker than in the other case.

In order to explain the function, the case must initially be viewed for which the cathode connection K relative to the anode connection A is switched onto positive potential. If the MOSFET M1 is switched on, the component then has the blocking capacity of the reverse polarized thyristor 1, 2, 3, 4. The voltage is absorbed almost completely by the anode-side pn-junction $J_1$ between the n-base zone 3 and the p-zone 4, since the pn-junction $J_3$ that is also polarized in blocking direction for the most part blocks only about 10 V between the $n^+$-zone 1 and the p-zone 2 because of the relatively high doping of the p-zone 2. Blocking current and breakdown voltage of the component are therefore essentially determined by the pnp-transistor 2, 3, 4, which is connected in series with the avalanching pn-junction $J_3$. If the MOSFET M1 is switched off, then the pn-junction $J_5$ between the p-zone 4 and the $n^+$-zone 5b is also polarized in forward direction, in addition to the junction $J_2$ between the n-base zone 3 and the p-zone 2. To be sure, the structure continues to block with the pn-junction $J_1$, but breakdown voltage and blocking current are now essentially provided by the forward blocking capacity of the thyristor structure 2, 3, 4, 5b.

Figure 4:
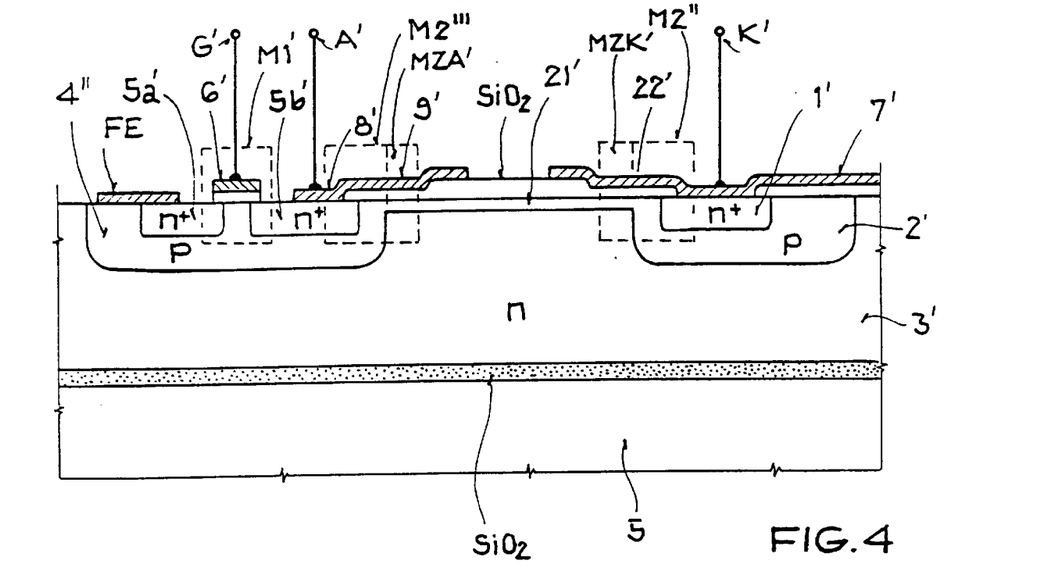
FIG. 4 showing an anode-side actuated, laterally integratable component.

When designing an anode-side actuated component according to FIG. 4, the reverse blocking capacity of the ICMT is improved by switching on a bypass from the n-base zone 3' to the cathode contact 7'. The same elements in FIGS. 1 and 4 are provided with the same reference numbers. The design according to FIG. 4 is described in more detail below.

For $V_K>V_A$, the MOSFET M2 for the arrangement shown in FIG. 1 is switched off, regardless of whether the MOSFET M1 is switched on or not because the gate 9 is lying at the potential for electrode 8 or the anode contact 8, which in this case constitutes the source for the MOSFET M2. Thus, the ICMT component is blocking with a positive potential at the cathode connection K, relative to the anode connection A, regardless of how the gate G is actuated. It is presumed here that the thyristor structure 2, 3, 4, 5b has a forward blocking capacity. This must be achieved without short-circuiting the pn-juncture $J_5$, since this junction must block in order to switch on the MOSFET M2.

Through a high integral doping concentration $N_{ip4}$ of the p-zone 4 below the $n^+$-zone 5b and low thickness of zone 5b, it is possible to obtain a stable forward blocking behavior of the thyristor 2, 3, 4, 5b, meaning a stable reverse blocking behavior of the ICMT if the MOSFET M1 is switched off, since the current amplification factor $\alpha_{n+pn}$ of the $n^+$pn-transistor 5b, 4, 3 is very low in that case. $N_{ip4}$ is preferably selected larger than about $2*10^{14}$ cm² for this.

If the cathode connection K relative to the anode connection A is lying at a negative potential and the MOSFET M1 is switched off, then the anode-side pn-junction $J_5$ is polarized in the blocking direction, and the p-zone 4 receives a negative potential as compared to the gate electrode 9. This potential, when taken absolute, adjusts to a value somewhat above the threshold voltage of the MOSFET M2, so that it is switched on and frees a bypass from the n-base zone 3 to the anode contact 8. If the MOSFET M1 is switched off, the blocking capacity of the ICMT is therefore not provided by the MOSFET M1 that blocks only slightly, but by the $n^+$pn-transistor 1, 2, 3, which has a low-ohmic connection to the anode 8 and a high blocking capacity via the pn-junction $J_2$. A precondition for this is that the breakdown voltage of the pn-juncture $J_5$ is clearly higher than the threshold voltage of M2. This is adjusted through the doping of the p-zone, near the pn-junction $J_5$ and on the surface, below the gate oxide. The breakdown voltage is, for example, 12 V, while the threshold voltage is 3 V.

However, if the cathode potential is smaller than the anode potential, meaning $V_K<V_A$, but the MOSFET M1 is switched on, then the thyristor structure below the floating electrode FE is stressed in forward direction. In this case, the MOSFET M2 is switched off because the p-zone 4 is lying at nearly the same potential as the gate electrode 9. If the thyristor structure that is not short-circuited here does not have forward blocking capacity or if it is switched on simultaneously with the MOSFET M1 by an additional ignition gate, which is described later on, then the component is in the on-state condition. In order to obtain a low on-state voltage, it is also desirable to have a high integral doping $N_{ip4}$ of the p-region 4, which functions as previously mentioned to obtain a stable reverse blocking capacity. A high $N_{ip4}$ results in a small current amplification factor $\alpha_{npn+}$ for the parasitic transistor 3, 4, 5b, which prevents too many electrons from flowing unused through the transistor 3, 4, 5b powered up by hole current to the anode contact. A high $\alpha_{npn+}$ would for the most part ruin the effect of the MOSFET M2, which is switched off in the on-state condition, and would lead to a high on-state voltage.

If the MOSFET M1 is switched off while the component is in the on-state condition, then this results in a switching on of the MOSFET M2, analogous to the stationary blocking condition, since in this case the pn-junction $J_5$ is also polarized in blocking direction by the charge carriers, which can no longer drain off through M1. The excess electrons in the structure here can drain off via the n-channel to the anode contact A. This bypass is no less important for the switching off operation than for the blocking condition, since the charge carriers that are stored during the on-state phase around the pn-junction J2 must be drained off so that the space-charge region around J2 can build up. Without the bypass via the MOSFET M2, a voltage could build up around the pn-junction J2 only through recombination of the charge carriers. For most applications, however, this occurs too slowly. With an inductive load, the current flows fully over the MOSFET M2 after the MOSFET M1 is closed, until the outer voltage is built up. Since the n-base zone 3 is now connected to the anode contact A and the MOSFET M1 no longer supplies any current, the switching off behavior of the component is given by that of the $n^+$pn-transistor 1, 2, 3 with open base. Since the power amplification factor and avalanche multiplication factor of such a transistor are considerably higher than for a pnp-transistor, the thickness and also the specific resistance of the n-base zone 3 are adjusted higher with a predetermined voltage to be switched on than for a standard component that is controlled from the cathode side, e.g. the IGBT or the GTO thyristor.

In order to render the thyristor conductive while there is negative voltage present at the cathode K relative to the anode A and while the MOSFET M1 is switched on, it is initially possible, as already mentioned, to design the thyristor such that it does not block in the forward direction without the bypass from the n-base zone 3 via M2 to the anode connection A. For this, the sum of the power amplification factors $\alpha_{npn}+\alpha_{pnp}$ is adjusted higher than 1 in the blocking current range already. This can be achieved in practical operations in that the degree of effectivity for the emitters is set high through a relatively high integral doping of the emitter zones and that the transporting factors for the partial transistors are adjusted high through the lowest possible integral doping of the p-base zone 2 and a high carrier lifetime. The ICMT unit cell in that case switches to the on-state condition as soon as the voltage between gate G and anode A or between gate G and FE exceeds the threshold voltage.

To be able to proceed in this way, the emitter base junction $J_3$ cannot be short-circuited, since the component blocks in a forward direction with a short-circuited junction, even without the bypass through the switched-on MOSFET M2. Corresponding measures were taken concerning this in the inventive, bidirectional switching element, since the n-emitter zone 1 is missing in some sections of the structure and the junction $J_3$ is short-circuited per se. In general, a thyristor that does not block in the forward direction in the relatively broad temperature range that is allowed has long switching times as a result of the required high carrier lifetime. Also, the blocking capacity is reduced when the MOSFET M2 is switched on because of the high power amplification factor $\alpha_{npn}$. It is therefore often better to use a thyristor, which has a forward blocking capacity even if the bypass for the n-base is switched off through the MOSFET M2. In accordance with the invention, an ignition gate is provided in that case to ensure that the thyristor switches to the on-state condition once a positive voltage is applied to the gate G.

Figure 2:
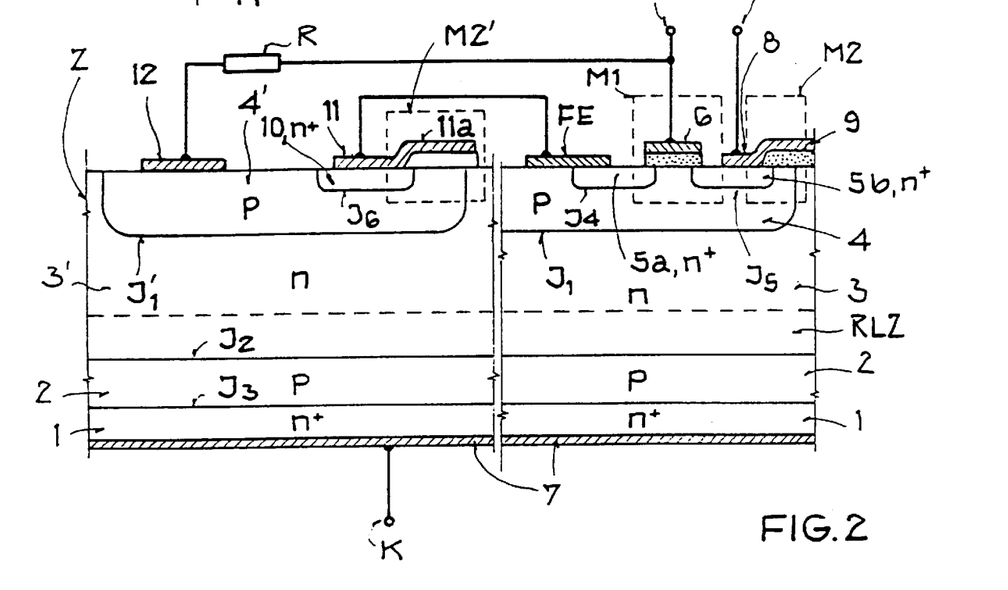
FIG. 2 is a section of a region of an anode-side actuated, integratable MOS component, which has a gate electrode for the ignition.

Such an ignition arrangement is shown in FIG. 2, wherein the same elements in FIGS. 1 and 2 are given the same reference numbers. In a region Z of the semiconductor component, which is separated from the floating electrode FE either by a larger distance or through interruption of the p-emitter zone 4, a p-emitter zone 4' is provided with the gate contact 12, which is connected via a resistor R with the gate connection G. A $n^+$-zone 10 that is embedded into the p-emitter zone 4' has a contact 11, which is connected to the floating electrode FE, but which does not short-circuit the pn-junction $J_6$ between p-zone 4' and $n^+$-zone 10 in the ignition region. With a positive voltage at the gate opposite FE, not only is FE connected via the n-channel in the unit cells with the anode contact 8 and the anode connection A, but gate current then flows into the p-emitter zone 4' of the ignition region, and the $n^+$-zone 10 injects electrons, which diffuse to the pn-junction $J_{1'}$ between p-emitter zone 4' and n-base zone 3 at the junction $J_{1'}$. As a result of this, the pn-junction $J_{1'}$ is polarized more in the on-state direction, so that the charge carrier concentration in the n-base zone 3 at junction $J_{1'}$ between the p-emitter zone 4' and the n-base zone 3, is raised. As a result of the concentration gradient, holes diffuse toward the space charging zone RLZ around the pn-junction $J_2$, between n-base zone 3 and p-base zone 2 and are there pulled off through the field into the p-base zone 2. As a result of this, they function as base current for the $n^+$pn-transistor 1, 2, 3 and actuate it. The collector current for this transistor flows into the n-base zone 3 and actuates the pnp-partial transistor 4', 3, 2 of the thyristor structure. As a result of this, more holes are flowing into the p-base zone 2 and the current increases until the thyristor is ignited. This ignition gate is related to the "remote gate" arrangement used for the Triac. The switched-on condition then spreads in the known way over the surface with the ICMT unit cells.

If the MOSFET M1 is switched off, then the current in the ignition region is also switched off. As for the unit cells according to FIG. 1, a MOSFET (M2') that connects the n-base zone 3 with the $n^+$-region 10 is additionally provided to permit an efficient switching off.

When switching off the n-base zone 3, it is therefore connected via the switched-on MOSFET M2, the floating electrode FE and the MOSFET M2 of the unit cells to the anode connection A. The thyristor 10, 4', 3, 2 of the ignition region is polarized in a forward direction for a reverse blocking stress of the ICMT. In general, it blocks only if no control current is fed to base 4' of this thyristor through positive voltage at gate G.

Figure 3:
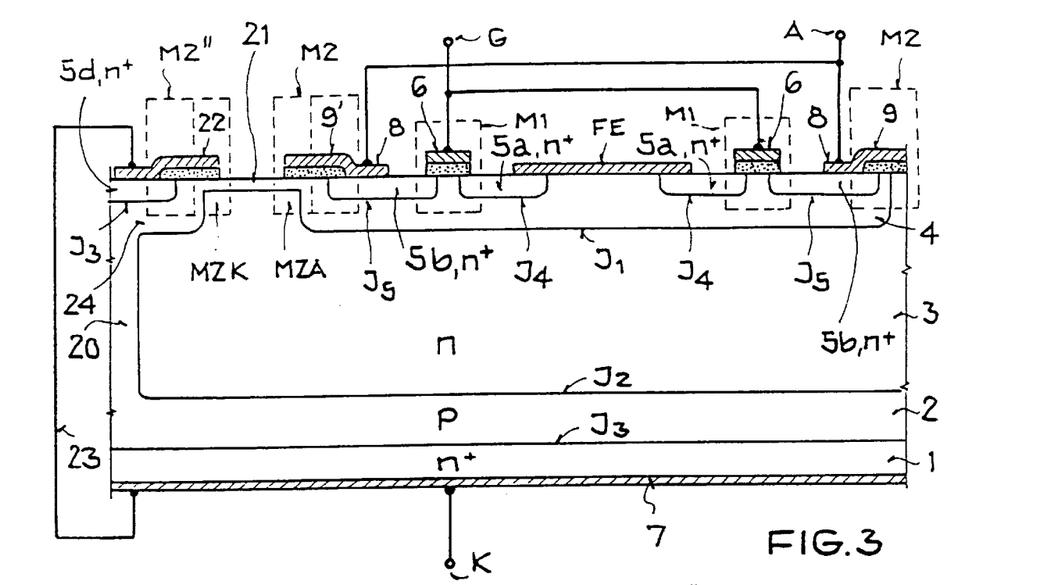
FIG. 3 showing the border region of an anode-side actuated, integratable MOS component for ignition with an MOS gate.

FIG. 3 shows another inventive arrangement for igniting the thyristor with the zones 1, 2, 3, 4 while the MOSFET M1 is switched on. In this case, the p-base zone 2 at the edge of the semiconductor element is conducted via a p-border zone 20 to the upper limiting level or surface of the semiconductor element or body, as is already known in a similar way from thyristors that block on both sides. At the upper limiting level, the p-base zone 2 forms a region 24 into which a $n^+$-zone 5d is embedded. The p-region 24 is not separated in the standard way from the upper p-emitter zone 4 inside the semiconductor wafer or body by the n-base zone 3 that emerges on the surface, but is connected with it through a p-channel zone 21 that is positioned at the surface. Thickness and integral doping of the p-zone 21 are adjusted such that one each depletion-type p-channel MOSFET MZA or MZK is formed, together with an above-arranged insulator and a gate electrode 9' that is installed toward the chip inside, as well as a second gate electrode 22 that extends from the border. The gate electrode 9' is connected to the outer anode contact 8. The gate electrode 22 simultaneously forms the contact layer for the $n^+$-zone 5d, which is connected such that it conducts with the cathode contact 7 on the lower limiting level or surface of the semiconductor element. Furthermore, on the surface of the p-region 24, an inversion-type MOSFET M2' is integrated, between the $n^+$-region 5d and the p-channel zone 21.

With a forward polarization of the component $V_K<V_A$ and switched-on MOSFET M1, a current path leads from the anode contact 8 via the floating electrode FE, the p-emitter zone 4, the p-channel zone 21 and the border zone 20 to the p-base zone 2' of the thyristor 1, 2, 3, 4. Hole current is fed into the p-base zone 2 via the current path, and the thyristor 1, 2, 3, 4 is ignited. The ignited condition then spreads from the border to the unit cells located on the inside. If the MOSFET M1 is switched off at $V_K<V_A$, then the pn-junction $J_5$ is polarized in blocking direction.

The inversion-type MOSFET M2 is switched on as a result and the depletion-type MOSFET MZA is switched off. The n-base zone 2 is thus connected to the anode contact 8, and the connection between the upper p-emitter zone 4 and the lower p-base zone 2 is interrupted. The voltage is essentially absorbed by the $n^+$pn-junction $J_2$, located between cathode K and anode A. The p-channel zone 21 here is emptied of charge carriers in the region outside of the MOSFET MZA, which leads to a reduction in the electrical field at the surface.

In case of reverse polarization of the component, meaning the cathode potential is greater than the anode potential ($V_K > V_A$), the pn-junctions $J_1$ and $J_3$ are polarized in blocking direction. Since the p-region 24 and the neighboring section of the n-base zone 3 have a positive polarization relative to the gate electrode, a n-channel develops on the surface of the p-region 24 and the p-channel for the MOSFET MZK disappears. The n-base zone 3 is thus connected with the cathode K. If the MOSFET M1 is switched on, the component blocks through the pn-diode 4, 3 and with switched-off MOSFET M1 through the n+pn-transistor 5b, 4, 3, wherein the pn-junction $J_3$ that absorbs only a few volts is connected in series. The p-zone 21 here is drained outside of the MOSFET MZK of charge carriers. As a result of this, the expansion of the space charge zone around the pn-junction $J_1$ at the surface is increased, and the surface field strength is reduced. As compared to the ignition gate according to FIG. 2, the arrangement according to FIG. 3 initially has the advantage that the component is switched on as well as off through MOS gate.

Another advantage is that the reverse blocking capacity is improved by switching on the bypass from the n-base zone 3 to the cathode K.

So that the MOSFET M1 remains switched off during the voltage build-up around the pn-junction $J_5$ and the MOSFET M2 switches on, it is not sufficient that the potential for anode A is applied to the gate G, since in that case both MOSFETs would switch on once the voltage at the pn-junction $J_5$ exceeds the threshold voltage for the MOSFETs. Rather, it is necessary to apply to gate G a negative voltage relative to A, e.g. a voltage of −5 V. The MOSFET M1 then remains switched off while M2 switches on, and the pn-junction $J_2$ starts to block.

If the voltage at the gate is set equal to zero, relative to the anode, the component must not necessarily switch off. Since the MOSFET M1 in that case does not remain fully shut down, it would also no longer represent a pure cascode circuit.

If gate G has a fixed, predetermined voltage relative to the anode A, for example $V_{GA} = 10$ V, then the component does not have a forward characteristic with current limiting since the n+-region 5b that is connected to the anode A functions as the drain region for the MOSFET M1 in the current-carrying ICMT. However, a MOSFET does not have a current limitation with fixed gate-drain-voltage. Yet, if the gate G is provided with a fixed voltage relative to the floating electrode FE, then this results in a current limitation. As a result of the MOSFET M2 which is then fully switched on, the n+pn-transistor 1, 2, 3 with the blocking pn-junction $J_2$ then ensures a current limitation up to high voltages.

The inventive principles, which were described in more detail for the vertical components, can be applied in a simple way also to the lateral components, for which both main electrodes, together with the control electrode, are arranged on the upper limiting level for the semiconductor element. FIG. 4 shows a lateral embodiment of the component according to FIG. 1, which can be switched on and off from the anode side. In addition to the anode and gate connection A' or G', the cathode connection K' and the cathode metallization 7' as well as the cathode emitter zone 1' with the surrounding p-base zone 2' of the thyristor structure 1', 2', 3', 4" are located on the surface of the semiconductor element. On the bottom, the n-base zone 3' is separated from the substrate below by an insulating layer (e.g. $S_1O_2$) or even a pn-junction. The anode metallization 8' and the cathode metallization 7' do not make contact with the p-zones 4" or 2', into which the contacting n+-zones 5b" and 5a' are embedded. Since the p-base zone 2' is also located on the upper main level, the p-base zone 2' and the p-emitter zone 4' of the thyristor 1', 2', 3', 4" are connected directly via the p-channel zone 21' which forms the depletion-type MOSFETs MZK', MZA', together with the oxide-overlapping metallizations 7', 8' for the anode and cathode. As described in connection with FIG. 3, the component blocks in the reverse direction, regardless of the gate voltage present, wherein the cathode-side MOS structure becomes effective and $J_1$ blocks.

With a forward polarization ($V_K < V_A$) and switched off MOSFET M1', the component blocks in a totally analogous manner. If the MOSFET M1' is switched on and the anode A thereby connected to the p-emitter zone 4", then the thyristor 1', 2', 3', 4" is ignited by the hole current flowing via the p-channel zone 21' into the p-base zone 2.

Figure 5:
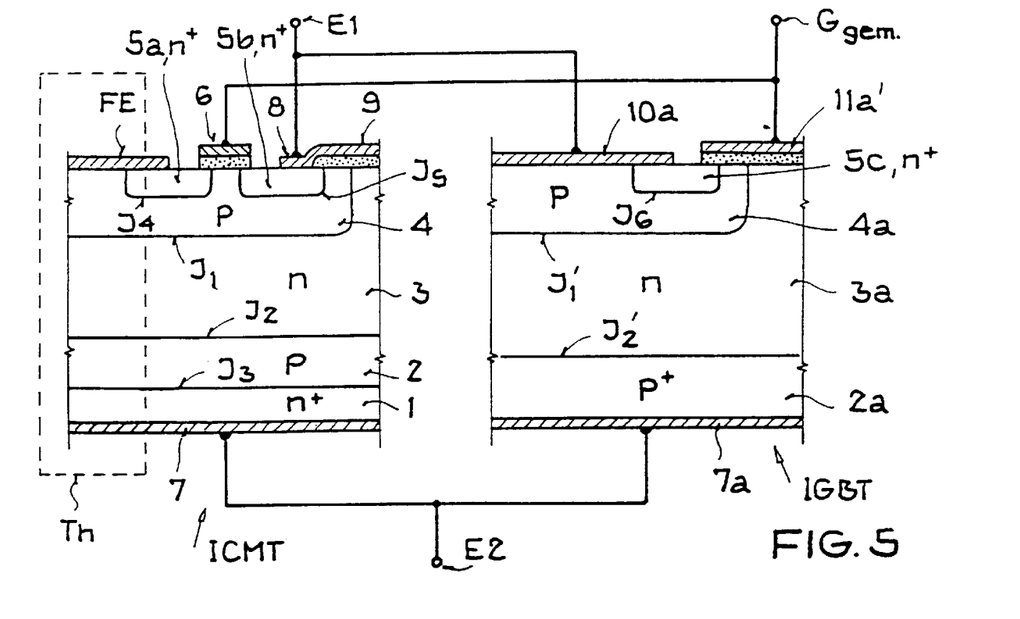
FIG. 5 illustrates a bidirectional component, comprising a unit cell according to FIG. 1 and an IGBT unit cell.

FIG. 5 shows a bidirectional switch, composed of the above-described ICMT unit cell 4 and an IGBT unit cell. The IGBT unit cell has the standard structure described in the following. The lower p+-zone 2a is followed by a weakly doped n-base zone 3a, which has a p-trough 4a on the surface, into which a n+-zone 5c is embedded. The p+-zone 2a is covered with a metallic contact layer 7a and the n+-zone 5c as well as the p-trough 4a with a joint metal layer 10a. A gate electrode 11a' is located above the region for the p-trough 4a, between the n+-zone 5c and the surface region for the n-base zone 3a. Together with the insulated gate electrode 11a', the n+-zone 5c, the surface region of the p-trough 4a and the n-base zone 3a form a n-channel MOSFET. The ICMT unit cell corresponds to the arrangement shown in FIG. 1. The thyristor can be ignited by an arrangement according to FIG. 3 that is not shown in FIG. 5. As can be seen, both parts of the bidirectional switch, the ICMT and the IGBT, can be produced with the aid of the same procedural steps, starting with a semiconductor wafer with n-doping. Only the lateral masking must be different, above all for the n+-zones. The lower contact electrodes 7, 7a serve both unit cells and are connected to a main electrode connection E2. On the upper limiting lever or surface, the anode electrode 8 of the ICMT and the cathode or source electrode 10a of the IGBT are connected with an upper main connection E1. The ICMT unit cells and the IGBT unit cells can also be arranged in different semiconductor components that are mutually connected by a hybrid circuit.

In FIG. 5, the gate electrode 6 of the ICMT and the gate electrode 11a' of the IGBT are connected by a joint outside gate connection $G_{gem}$. However, the ICMT and the IGMT can also have separate gate connections G1 and G2 and can thus be actuated separately, which has certain advantages that are described in more detail below. In contrast to the known bidirectional switches, the two gates here are actuated by the same reference electrode E1 or FE, which is why the control expenditure does not increase as much in comparison to the case with a gate. In the monolithically integrated form, the two types of unit cells for the bidirectional semiconductor component according to FIG. 5 are each arranged in a separate surface region of the semiconductor element or body. As a result of being spaced apart relatively far, it is prevented that the pn-junctions $J_3$ and $J_1$ of the ICMT part are short-circuited or that the thyristor structure is switched on, which is formed by the p-zone 4a of the IGBT and the npn-zone succession 1, 2, 3 of the ICMT and cannot be switched off through the gate.

Figure 6A:
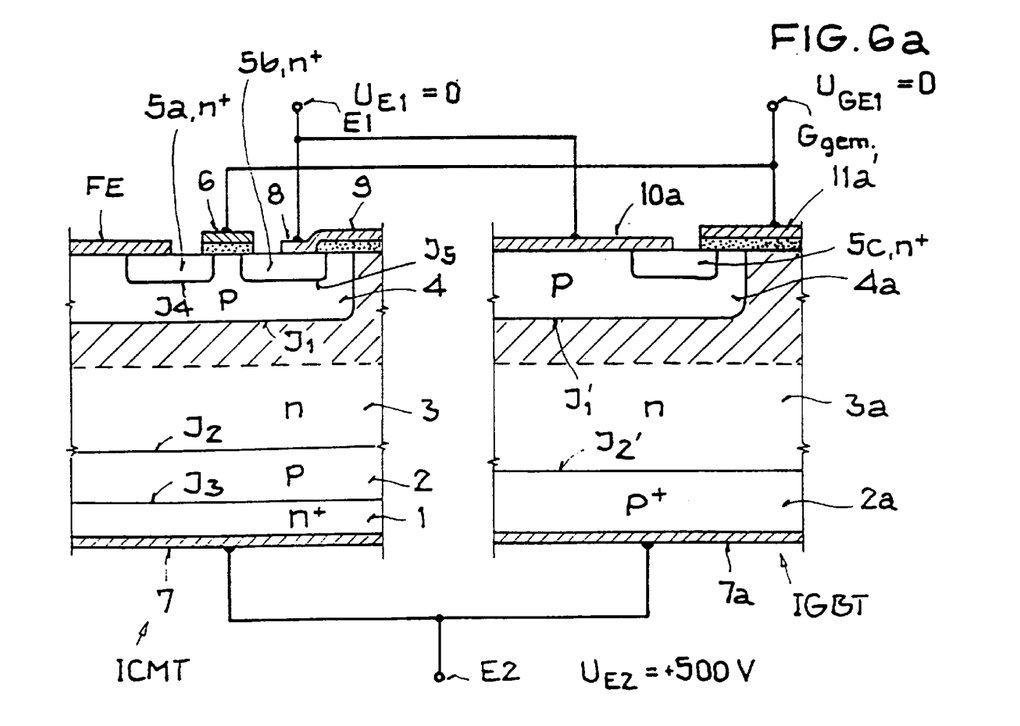
FIG. 6a showing the bidirectional component in the forward blocking condition (operating point on the blocking characteristic in first quadrant)

The operation of the bidirectional component is described with the aid of FIGS. 6a to 6d. In the first quadrant of the current-voltage level, a positive voltage $U_{E2}$ is present at the lower main connection E2, relative to the upper main connection E1, which always has zero potential, meaning $U_{GE1}=0$. With this polarization and regardless of the gate voltage that is present, the ICMT cell is blocking through the pn-junction $J_1$, between p-trough 4 (anode emitter) and n-base 3, as explained above. If the voltage $V_{GE1}$ of the gate is equal to zero relative to E1, then the IGBT is also in the blocking condition, wherein the voltage is again absorbed by the pn-junction J', between p-zone 4a and n-base 3a. This is indicated in FIG. 6a by the hatched area following $J_1$, $J_1'$. The combination component thus is in the forward blocking condition, which is described by an operational point on the blocking characteristic in the first quadrant.

Figure 6B:
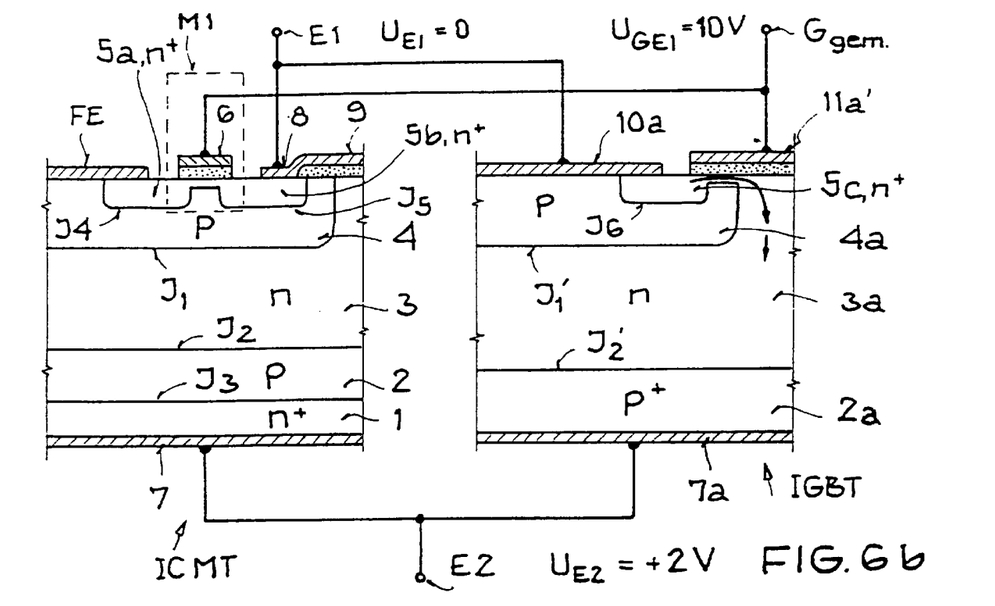
FIG. 6b showing the bidirectional component in the forward on-state condition (operating point on the forward characteristic in first quadrant)

According to FIG. 6b, the voltage at the electrode E2 remains positive, e.g. +500 V. However, a positive voltage of, for example, 10 V is now present at the gate $G_{GEM}$, which is higher than the threshold voltage for the MOSFETs. Thus, the IGBT switches in the known way to the on-state condition. In the ICMT cell, the floating anode connection of the thyristor is connected via the n-channel of MOSFET M1 with the main connection E1, to be sure. However, the thyristor continues to be in the reverse blocking condition, wherein the voltage has of course collapsed to the on-state voltage of the IGBT. The combined bidirectional component is in the forward on-stage condition, which is determined by the IGBT.

Figure 6C:
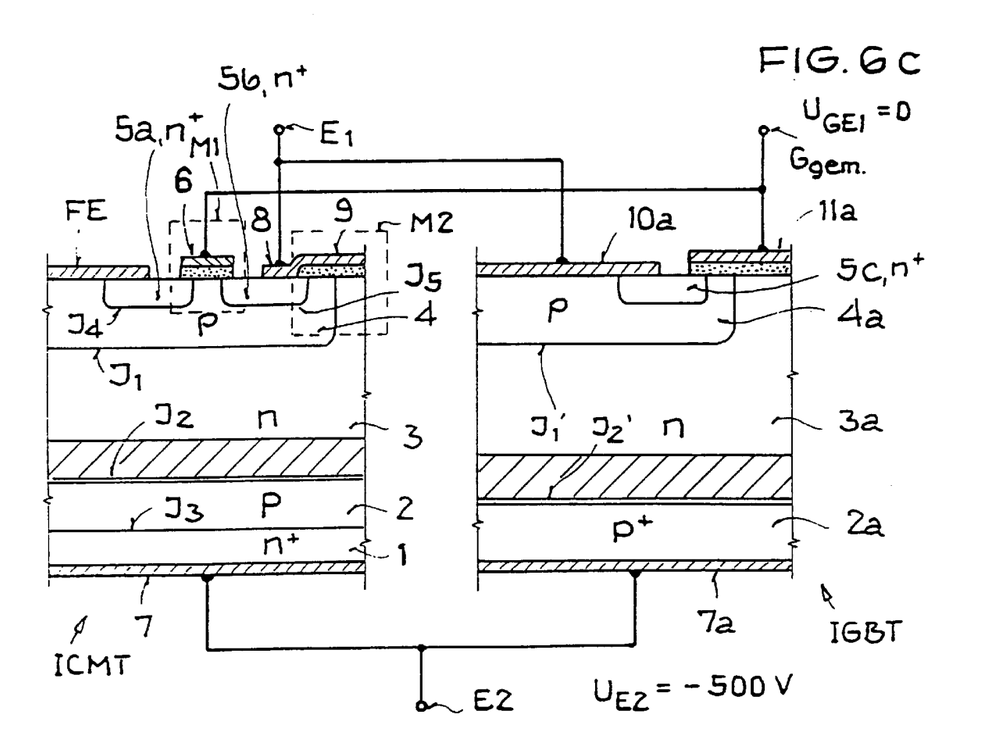
FIG. 6c showing the bidirectional component in the reverse blocking condition (operating point on the blocking characteristic in third quadrant)

If the electrode E2 is connected to a negative potential relative to E1, one is in the third quadrant. With this polarization, the IGBT blocks through the lower pn-junction $J_2$, regardless of which gate voltage is present. If the MOSFET M1 is switched off, the ICMT blocks as well, that is also through the pn-junction $J_2$ between n-base 3 and lower p-zone 2, as described in the above. This case is shown in FIG. 6c. The internal MOSFET M2 is switched on in this condition, so that the n-base zone 3 is connected to the upper main connection E1 via the bypass X to the anode-side pn-junction $J_1$. As mentioned above, the breakdown voltage of the pn-junction $J_5$ must clearly be adjusted higher than the threshold voltage of the MOSFET M2 for this.

Since the switching off operation is determined by the lower $n^+$pn-transistor 1, 2, 3, the thickness and specific resistance of the n-zone 3a is adjusted higher than would be necessary for the IGBT alone in order to obtain a given, secure operating range during the switching off.

Figure 6D:
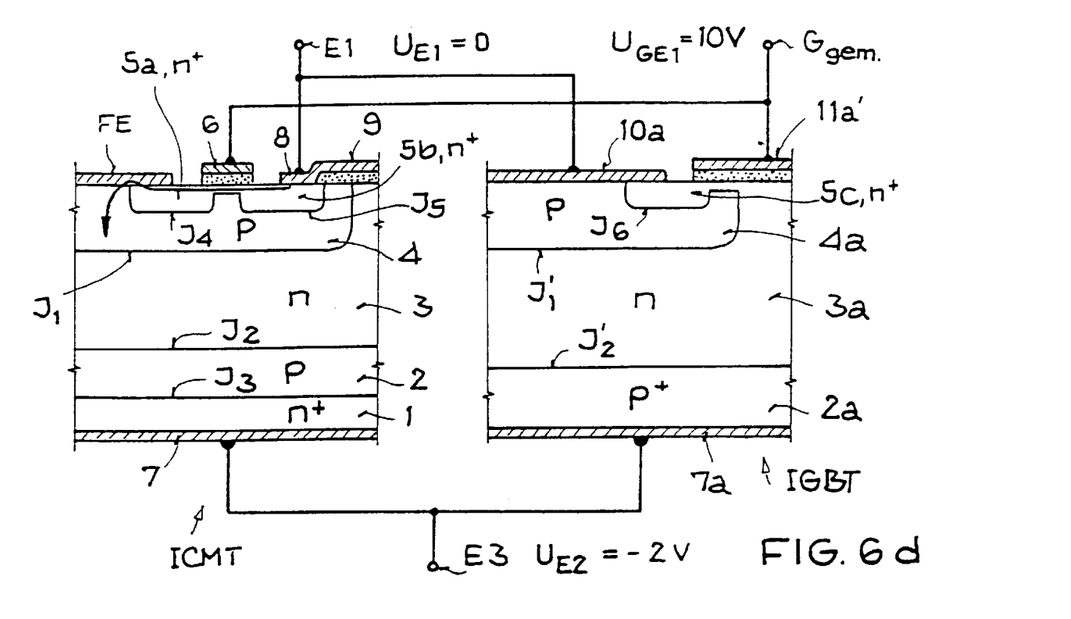
FIG. 6d showing the component in on-state condition (operating point on the on-state characteristic in third quadrant).

If, with continued negative potential at E2, the voltage at gate G is raised to a value above the threshold voltage for the MOSFETs, then the IGBT remains in the blocking position, as already mentioned. In the ICMT unit cell, the emitter zone 4 of the thyristor is connected via the floating electrode and the n-channel of the MOSFET M1 with the outer electrode E1. As a result of this, the potential in the p-zone 4 increases from the former negative value to nearly the value of zero of electrode E1, so that the n-channel in the MOSFET M2 disappears, meaning it is switched off. The thyristor 1, 2, 3, 4 must switch on at the same time. It must be taken into consideration here that the $n^+$-zone 1 is missing in the surface region with the IGBT cells and the pn-junction J3 thus normally ends on the lower surface and is short-circuited by the joint IGBT and ICMT metallization 7.

However, if the ignition occurs with the aid of the arrangement according to FIG. 3 or owing to the fact that the thyristor 1, 2, 3, 4 is designed without forward blocking capacity, then the pn-junction $J_3$ must not be short-circuited.

Figure 7:
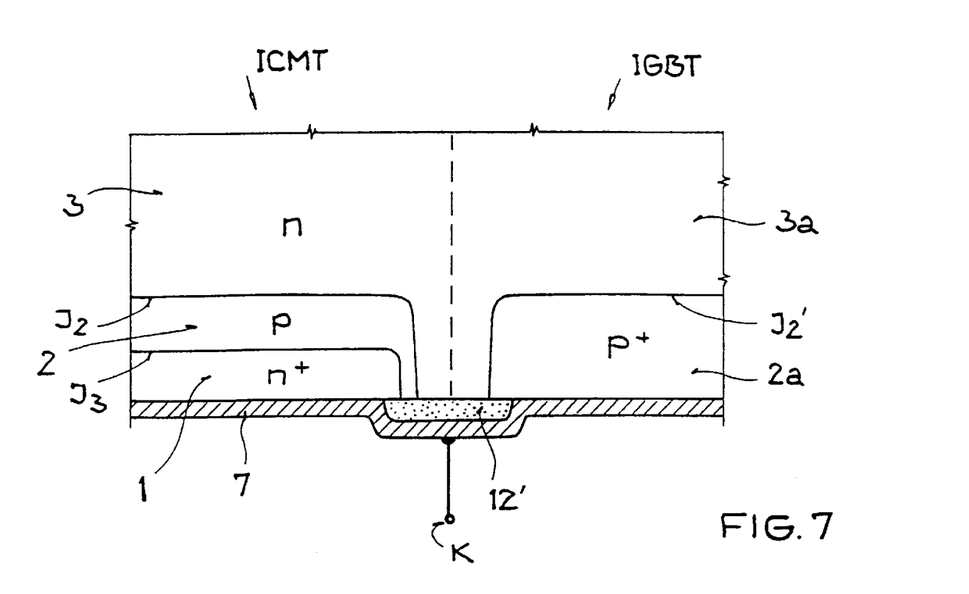
FIG. 7 illustrate a section of a segment of a bidirectional component with non-shortened pn-junction at a main electrode.

For the embodiment of the inventive bidirectional switching element, the region of the lower limiting level with the pn-junction $J_3$ is covered with an oxide layer 12' or another insulating layer to prevent the short-circuiting, as shown in FIG. 7. Even the p-zone 2 of the ICMT runs out shortly after the $n^+$-emitter zone 1 and ends in the surface region that is covered by the oxide, so that it has no contact with the metallization 7 of the lower limiting level or surface of the semiconductor element.

The p-zone 2a of the IGBT starts at a distance from this and is separated from the p-base zone 2 of the ICMT by the n-base zone 3 that emerges on the insulating surface. The width for the n-base zone 3 on the surface is so small that the blocking capacity of the pn-junction $J_2$ is not impaired. The pn-junction $J_3$ can then be polarized in the blocking direction, which is necessary to the function of the design of the border according to FIG. 3. Also, the thyristor 1, 2, 3, 4 can now be dimensioned in the such a way that it does not block in forward direction without shorting through the internal MOSFET M2. The separation of the p-base zone 2 and the anode-side p-zone 2a of the cathode-side actuated component can also occur through a gap that is advisably filled with insulating material.

A bidirectional component has been created with this, which is conducting with positive gate voltage, but which blocks with disappearing or negative gate voltage. The component switches on if the gate voltage is increased to a value above the threshold voltage, while it switches off if the gate voltage is lowered to zero or a negative value, that is with positive voltage of the lower electrode E2 relative to E1 (first quadrant) as well as with negative polarization of E2 relative to E1 (third quadrant).

In addition to the option of preventing the short-circuiting of junction $J_3$ and to design the thyristor 1, 2, 3, 4 as non-blocking in the forward direction, there is also the alternative option of using an ignition gate according to FIG. 2. However, this gate has the characteristic that it can switch on the upper thyristor structure 2, 3, 4, 10 of the ignition region if the polarization is V(E2)>V(E1) and with positive gate voltage since control current is then fed into its p-base 4. The ignited condition cannot spread to the thyristor 5b, 4, 3, 2 of the unit cells, to be sure, since with positive gate voltage the emitter junction $J_5$ of this thyristor is short-circuited by the inversion channel of the floating electrode FE. However, the switched on ignition region cannot be switched off simultaneously with the IGBT by the MOSFET M1, owing to the parallel position of pn-junction $J_5$ with on-state polarization. In order to prevent the switching on of the ignition region, it is therefore necessary when using this ignition gate to provide the gate electrode 6 of the ICMT with its own gate connection G1 and the gate electrode 11 of the IGBT with a separate gate connection G2 and to actuate both with different control signals. In the first quadrant (V(E2)>V(E1)) only the IGBT is then actuated with a positive gate voltage while the voltage at the ICMT gate G1 relative to FE is adjusted equal to zero or negative.

Figure 8:
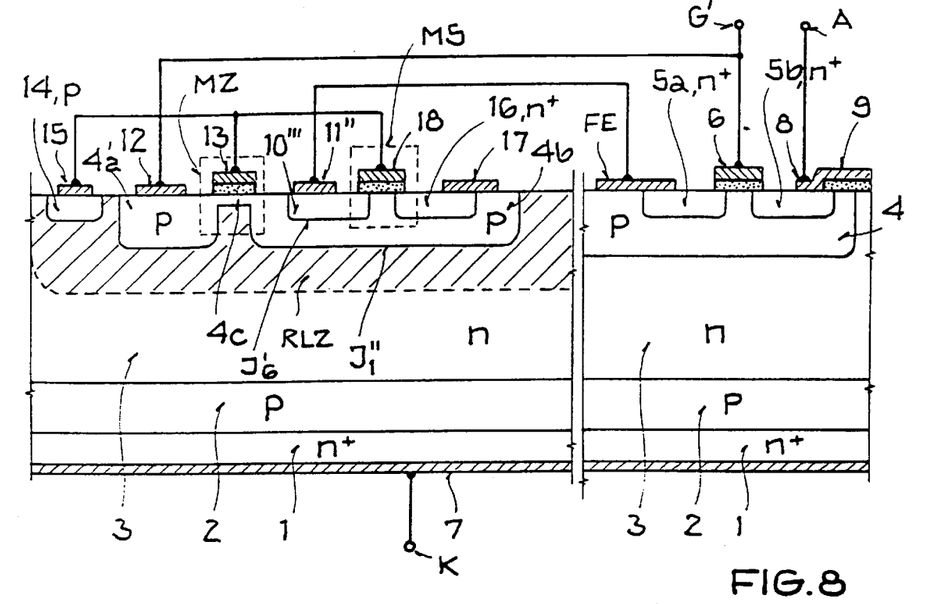
FIG. 8 illustrate a section of a specially designed ignition region of an anode-side actuated MOS component, which is used to prevent a switching-on during reverse loads.

The embodiment shown in FIG. 8 of the ignition region of a bidirectional component, composed of an ICMT and an IGBT, makes it possible to actuate the ICMT and the IGBT via a single gate connection G', even if an ignition gate is required. For the polarization V(E2)<V(E1) of the main electrodes E1, E2, this gate G' causes a switching on of the thyristor 1, 2, 3, 4 of the ICMT if a positive gate voltage is applied. For V(E2)>V(E1), a positive gate voltage can be applied without the ICMT portion of the component being switched on.

The p-region that is provided with a gate contact 12 has its own p-trough 4a', which is connected only by a p-channel 4c to the trough-shaped p-region 4b, comprising the $n^+$-zone 10''' with electrode 11'' connected to FE. Together with an insulated electrode 13, located above the p-channel, the regions 4a', 4c, 4b in connection with the substrate of the n-base zone 3 form a depletion-type p-channel MOSFET M2. Positioned in front of the p-region 4a' is an additional p-region 14 with a contact 15, which region 14 is embedded like a trough in the n-base zone 3. This contact 15 has a conducting connection to the gate electrode 13 of the MOSFET MZ. With the assumed positive voltage at the electrode E2, relative to E1, a space-charge zone RLZ forms around the blocking pn-junction $J_{1''}$ during the blocking condition of the component, as drawn in Figure 8. As a result of this, the p-region 14 has a positive potential relative to 4a'.

Owing to this potential at the gate electrode 13 and the voltage at substrate 3, the p-channel between the regions 4a' and 4b is made to disappear, so that no gate current can flow into the region 4b and can ignite the thyristor 10''', 4b, 3, 2. In order to obtain a stable blocking behavior for this thyristor, another arrangement is provided in FIG. 8, which short-circuits the pn-junction $J_6$ between the p-zone 4b and the $n^+$-zone 10'' for the polarization VK>VA. This occurs with the aid of a $n^+$-zone 16, embedded as a trough into the p-zone 4b, which has a contact 17 that simultaneously makes ohmic contact with the zone 4b. The $n^+$-zone 16, $n^+$-zone 10''' and the interposed p-region with the above-arranged insulating gate electrode 18 form a n-channel MOSFET MS. The gate 18 of this MOSFET is connected to the p-zone 14 installed in front and therefore has a positive potential relative to the regions 4b and 16 if the polarization of the main electrode is $V_K > V_A$. Thus, the MOSFET MS is switched on and connects the $n^+$-region 10 low-ohmic with the p-zone 4b. The blocking capacity of the component for $V_K > V_A$ is improved considerably if the short-circuit of the pn-junction $J_6$ is switched on.

The thyristor comprising 1, 2, 3, 4 is switched on through the ignition gate structure shown in FIG. 8 if V(E2)<V(E1). However, the thyristor structure 2, 3, 4b, 10 is not ignited in the first quadrant where it is polarized in the forward direction. The blocking behavior is additionally stabilized in the first quadrant owing to the fact that the short-circuit for the pn-junction $J_6$ is switched on.

If a current limiting characteristic is required for the bidirectional switch, then this can be achieved by actuating the gate G in FIG. 8 not with a fixed voltage relative to the main connection E1, but relative to the floating electrode FE. It follows directly from the explanations for the ICMT that this is the case for the third quadrant at V(E2)<V(E1). However, this is also the case for this actuation in the first quadrant, since the electrode FE with positive gate voltage $V_{G,FE}$ is practically lying at the potential of E1 since the switched-on MOSFET M1 carries only the current for the thyristor blocking in reverse direction. If $V_{G,FE} = 0$, then the component, in this case the IGBT, is also placed in the blocking position. The electrode FE in that case assumes a potential relative to E1, which is provided by the voltage of the pn-junction $J_5$ that has a weak forward polarization owing to the blocking current. For example, FE and thus also G has a potential of 0.3 V relative to E1 if $V_{G,FE} = 0$, while the threshold voltage in components of this type typically has values around 3 or 4 V, so that the IGBT blocks. Thus, if the gate is controlled with a fixed voltage relative to the floating electrode, then the bidirectional component has the desired features, in particular it has a characteristic with current limitation in the first as well as the third quadrant.

Figure 9:
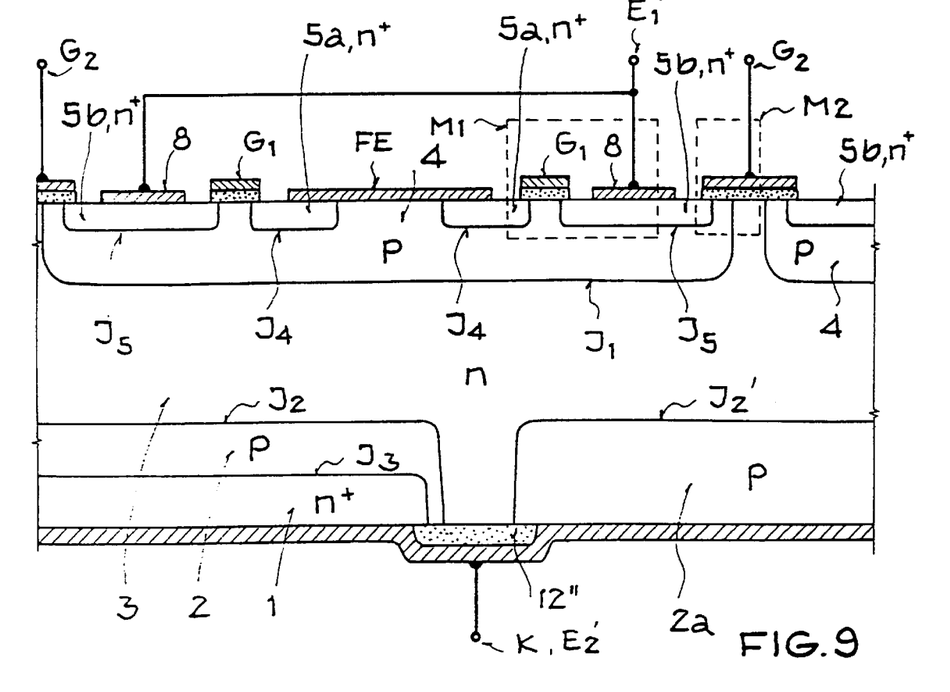
FIG. 9 illustrate a section of a unit cell with bidirectional switching capability.

For an embodiment with two different gates, which here are actuated from the one main electrode E1, as opposed to the known bidirectional switches, another important advantage can be achieved in addition to the usability of the simpler ignition structure according to FIG. 2, in place of FIG. 8. This advantage consists of being able to combine the full bidirectional switching ability in one single unit cell. This permits using one and the same surface for carrying the current in both directions, so that the required semiconductor surface is reduced considerably as compared to the case with only one gate connection. Such a unit cell that is bidirectional in itself is shown in FIG. 9. It differs from the ICMT unit cell according to FIG. 1 only in that the gate for MOSFET M2 is not fixedly connected to the outer electrode A (E1' in FIG. 9), but is separate from it and can be actuated from the outside via a separate gate connection G2.

In accordance with the embodiment shown in FIG. 9, a short-circuiting of the pn-junction $J_3$ is prevented with the aid of an oxide layer 12''. Since the thyristor structure 1, 2, 3, 4 is supposed to conduct well in the third quadrant, which is however impaired by the junction $J_3$ that functions as collector, the lateral expansion of the $n^+$-emitter zone 1 as well as the p-zone 2a must be greater than the lateral cell pitch. The surface regions having only one p-zone 2a below and the regions which also have a $n^+$-emitter zone 1 can also alternate in "strip direction," perpendicular to the drawing plane. If the MOSFET M1 is switched on, then the component functions like an IGBT that is switched by the gate G2. If G2 is connected to E1, then the function of an ICMT switchable through gate G1 is obtained.

Thus, for $V_{E2} > V_{E1}$ in the first quadrant, the gate E1 is lying at a positive potential relative to E1 (or FE), so that the MOSFET M1 is switched on. The thyristor 1, 2, 3, 4 then has reverse polarization, and the right portion of the structure, namely 2a, 3, 4, 5b together with the MOS gate G2 behaves like an IGBT. The component switches on with a positive voltage at G2 relative to E1. If the voltage is lowered to zero, then it switches off. In the third quadrant, for $V_{E2} < V_{E1}$, G2 is connected to the electrode E1', so that the component functions like the ICMT in FIG. 1. It can be switched on and off by actuating the gate G1, as is described there.

The fact that the $n^+$-base zone 1 like the p-emitter zone 2a respectively covers only a portion of the lower limiting surface does not essentially interfere with the function of the ICMT or the IGBT since the base zone 3 is considerably thicker than the lateral expansion of the gap in the lower n-emitter zones 1 and the zone 2a for the ICMT or the IGBT function.

The MOS inversion channels on the upper main level of the semiconductor element are nevertheless effective over the total channel width, meaning the expansion perpendicular to the drawing plain. Thus, a bidirectional component has been created with relatively small surfaces and simultaneously wide channel width. Thus, neither the channel resistance nor the on-resistance inside the semiconductor are raised significantly while the active component surface is cut nearly in half.

Analogous to FIG. 5, the anode-side controlled, lateral component according to FIG. 4 can be combined with standard components, e.g. a lateral IGBT with unit cells arranged in another surface region, to form a lateral bidirectional semiconductor element. The gate electrodes for both individual components as a rule have a joint gate connection. As described with the aid of FIG. 6, the component is switched on with positive gate voltage and switched off with negative or disappearing gate voltage, independent of the polarity of the main electrodes.

We claim:

1. An anode-side actuated semiconductor component, including a semiconductor element which has a plurality of side-by-side parallel-connected unit cells with a thyristor structure, and with the thyristor structure of a unit cell including higher doped p-zones, including a p-base zone (2) and a p-emitter zone (4) bordering on opposite sides of a weakly doped n-base zone (3); and where the p-base zone (2) borders on a highly doped n-emitter zone (1), which makes contact with a cathode electrode (7); and wherein for each unit cell: the p-emitter zone (4) is trough shaped and formed in the n-base zone adjacent one major surface of the semiconductor element; a first and a second $n^+$-zone ($5a$, $5b$) are embedded, at a distance from each other in the p-emitter zone (4) adjacent the one major surface; the first and second $n^+$-zones ($5a$, $5b$) together with a p-region portion of the p-emitter zone (4) that exceeds to the one major surface in-between the first and second n-zones and an insulated first gate electrode (6) disposed on the one major surface above the p-region portion form a first n-channel MOS field effect transistor (M1), which is connected in series with the thyristor structure through a floating electrode (FE); the second $n^+$-region ($5b$) is adjacent an edge of the trough-shaped p-emitter zone (4) and together with a portion of the n-base zone (3) that extends to the one major surface adjacent said edge, a region of the p-emitter zone (4) extending to the one major surface between the second $n^+$-zone and the n-base zone and a second gate electrode (9) arranged on the one major surface over the region of the p-emitter zone form a second n-channel MOS field effect transistor (M2); and a drain electrode of the first MOSFET (M1), which makes contact with the second $n^+$-zone ($5b$), simultaneously forms an outer anode electrode (8), which is separated from the p-emitter zone (4) by an insulating layer.

2. Semiconductor component according to claim 1, wherein the unit cells are subdivided by a trough-shaped design for the p-emitter zone (4).

3. Semiconductor component according to claim 1, wherein: a vertical embodiment of the thyristor structure is provided with the n-emitter zone (1), the p-base zone (2), the n-base zone (3), the p-emitter zone (4), and the anode electrode (8) being arranged one above the other; and the cathode electrode (7), which is connected to the n-emitter zone (1), is arranged on a lower limiting level or major surface of the semiconductor element and the anode electrode (8) as well as the first gate electrode (6) are arranged on the upper limiting level or one major surface of the semiconductor element.

4. Semiconductor component according to claim 1, wherein: at a distance from the floating electrode (FE) or separated from it by an interruption in the p-emitter zone, an ignition region is arranged in the semiconductor element, with the ignition region comprising a p-emitter zone (4'), a therein embedded $n^+$-zone (10) of the n-base zone (3) that borders the p-emitter zone (4'), the adjoining p-base zone (2) and the following n-emitter zone (1); the p-emitter zone (4') of the ignition region has an ignition-gate-contact (12), which is connected via a resistor with the first gate electrode (6); and the embedded $n^+$-zone (10) is provided with a contact electrode (11) that is connected to the floating electrode (FE), but which does not short-circuit the pn-junction (J6) in the ignition region between the p-emitter zone (4') of the ignition region and the embedded $n^+$-zone (10).

5. Semiconductor component according to claim 1, wherein: the p-base zone (2) is carried to the upper limiting level or one major surface by a p-border zone (20) of the semiconductor element and there forms a p-region (24), into which a further $n^+$-zone ($5d$) is embedded, which further $n^+$-zone is connected conductively with the cathode electrode (7); the p-region (24) and the p-emitter zone (4) are connected on the surface by a p-channel zone (21) which, together with the gate electrode (9') of the second MOS field effect transistor (M2) that overlaps the p-channel zone (21) at the edge of the p-emitter zone, forms a depletion-type p-channel MOS field effect transistor (MZA); a third insulated gate electrode (22), which is connected conductively to the cathode-side contacted further $n^+$-zone ($5d$) and overlaps the channel zone (21) at the edge of the p-region (24), forms an additional depletion-type MOS field effect transistor (MZK); and, a MOS field effect transistor of the inversion type (M2") is formed from the cathode-side contacted further $n^+$-zone ($5d$) and the p-region (24) that extends to the one major surface, together with the third insulated gate electrode (22).

6. Semiconductor component according to claim 1, wherein: the n-base zone (3') is arranged on a substrate (5), separated from it by one of an insulating layer or a pn-junction; the p-base zone (2') and the p-emitter zone (4") are arranged in respective trough shapes in the n-base zone (3), at a lateral distance from each other that is predetermined by the blocking capacity; and the n-emitter zone (1') is arranged in the p-base zone (2') and the source and drain zones ($5a'$, $5b'$) for the first MOS field effect transistor (M1') are arranged in the p-emitter zone (4").

7. Semiconductor component according to claim 6, wherein: the p-base zone (2') and the p-emitter zone (4") are connected at the one major surface by a p-channel zone (21') which, together with the insulated gate electrode (9') of the second MOS field effect transistor that overlaps the p-channel zone (21') at the edge of the p-emitter zone (4"), form a depletion-typdepletion-type MOS field effect transistor (MZA') and which, together with a gate electrode (22') that is connected to the cathode electrode (7'), forms an additional depletion-type p-channel MOS field effect transistor (MZK'); and an inversion-type n-channel MOS field effect transistor (M2") is formed by the n-emitter zone (1') and the p-base zone (2'), which extends to the one major surface, together with the gate electrode (22') that is connected to the cathode electrode.

8. A bidirectional semiconductor component comprising an anode-side actuated semiconductor component (ICMT) according to claim 1 and a cathode-side gate actuated component (IGBT) in a hybrid circuit; and wherein the anode connection of the anode-side actuated semiconductor component (ICMT) and a cathode connection of the cathode-side actuated semiconductor component (IGBT) are combined to form a single first main electrode (E1); and the cathode of the anode-side actuated semiconductor component (ICMT) and an anode of the cathode-side actuated semiconductor component (IGBT) are combined to form a second main electrode (E2).

9. A bidirectional semiconductor component according to claim 8, wherein: the gate electrode ($11a'$) of the cathode-side actuated semiconductor component (IGBT) and the gate electrode (6) of the first MOS-FET (M1) of the anode-side actuated semiconductor component (ICMT) are combined to form a joint gate electrode ($G_{gem}$).

10. A bidirectional semiconductor component comprising an anode-side actuated semiconductor component (ICMT) according to claim 1 and a cathode-side actuated semiconductor component (IGBT); and wherein: the unit cells of the anode-side actuated semiconductor component (ICMT) are monolithically integrated in the semiconductor element with unit cells of the cathode-side actuated component (IGBT); and the unit cells of the anode-side actuated semiconductor component (ICMT) are arranged in a first surface region and the unit cells of the cathode-side actuated semiconductor component (IGBT) are arranged in a second surface region of the semiconductor element.

11. A bidirectional semiconductor component according to claim 10, wherein: in the second surface region, the unit cells of the cathode-side actuated semiconductor component form an insulated gate bipolar transistor (IGBT) with an anode-side p-zone (2a), a n-base zone (3a) and a cathode-side p-zone (4a), into which is embedded an additional n+-zone (5c), which forms a MOS field effect transistor together with the n-base zone (3a), the p-zone (4a) and an insulated gate (G); and the cathode-side electrode (10a) is connected to the anode-side electrode (8) of the anode-side actuated semiconductor component.

12. A bidirectional semiconductor component according to claim 10, wherein: the gate electrode (11a′) of the cathode-side actuated semiconductor component (IGBT) and the gate electrode (6) of the first MOS-FET (M1) of the anode-side actuated semiconductor component (ICMT) are combined to form a joint gate electrode ($G_{gem}$).

13. A bidirectional semiconductor component according to one of the claim 10, wherein: said component is formed from a single group of bidirectionally switchable unit cells but with sections of the n-emitter zone (1) and the p-base zone (2) being replaced by a p-zone (2a) that borders the cathode metallization and which is separated from the n-emitter zone (1) and the p-base zone (2); the anode metallization and the cathode metallization of the component are connected to a first and a second main electrode (E1′, E2′), and that the first and second MOS field effect transistor (M1, M2) have externally actuated gates (G1, G2); given a conductive connection of the gate (G2) and the second MOS field effect transistor (M2) with the first main electrode (E1′), the component is an anode-side actuated semiconductor component (ICMT), and for a positive actuation of the gate (G1) of the first MOS field effect transistor (M1), the component is a cathode-side actuated insulated gate bipolar transistor (IGBT).

14. A bidirectional semiconductor component according to claim 10, wherein: an anode-side actuated component is arranged in the first surface region of the semiconductor element and a lateral insulated gate bipolar transistor (IGBT) is arranged in the second surface region of the same semiconductor element; and the gate of anode-side actuated unit cells and the gate of cathode-side actuated unit cells are combined to form a single gate.

15. A bidirectional semiconductor component according to claim 10 wherein: an ignition gate is provided in a region separate or at a distance from the first surface region, with the ignition gate comprising the n-base zone (3) into which a trough-shaped p-zone (4a′) with a gate electrode (12) is embedded, which is connected to the gate electrode (6) of the anode-side actuated component and which furthermore has a second p-zone (4b), embedded in the n-base zone (3), that is connected by a depletion-type MOS field effect transistor (MZ) with the p-zone (4a′) and comprises an additional n+-zone (10″) with a contact electrode (11″) which is connected to the floating electrode (FE), and the gate electrode of the depletion-type MOS field effect transistor (MZ) is connected to the contact electrode (15) of a p-zone (14), additionally embedded in the n-base zone (3), which is located in the space-charge zone around a pn-junction (J1″) for the reverse blocking operation of the anode-side actuated component (ICMT).

16. A bidirectional semiconductor component according to claim 15, wherein: a further additional n+-zone (16) is embedded into the second p-emitter zone (4b), which has a joint, floating short-circuiting contact (17) with the p-emitter zone (4b); and the two additional n+-zones (10″, 16), together with the p-region portion of the p-zone (4b) extending between the two additional n+-zones and a gate electrode disposed on the one major surface over the p-region extending between the two additional n+-zones, form a n-channel MOS field effect transistor, the gate electrode (18) of which is connected to the contact electrode (15) of the p-region (14).

17. A bidirectional semiconductor component according to claim 10, wherein: in the border region between the first and second surface regions, the n-emitter zone (1) and the p-base zone (2) of the anode-side actuated semiconductor component (ICMT) are separated from the anode-side p-zone (2a) of the cathode-side actuated semiconductor component (IGBT) in the first surface region, and are separated from each other in the second surface region.

18. A bidirectional semiconductor component according to claim 17, wherein: the p-base zone (2) of the anode-side actuated semiconductor component (ICMT) and the anode-side p-zone (2a) of the cathode-side actuated semiconductor component (IGBT) end at a distance from each other and are separated by a portion of the n-base zone (3) that extends in-between same at the lower limit or major surface of the semiconductor element; and the p-base zone (2) that extends to the lower major surface and the n-base zone (3) are insulated against the metallization on the lower major surface of the semiconductor element by an insulating layer (12′).

19. A bidirectional semiconductor component according to claim 17, wherein: the p-base zone (2) of the anode-side actuated component (ICMT) and the anode-side p-zone (2a) of the cathode-side actuated component (IGBT) are separated by a gap which is integrated into the semiconductor element, and which is filled with insulating material.

\* \* \* \* \*